United States Patent [19]

Ovens et al.

[11] Patent Number: 4,800,296
[45] Date of Patent: Jan. 24, 1989

[54] METASTABLE DEFEATING FLI-FLOP

[75] Inventors: Kevin M. Ovens; Jay A. Maxey, both of Garland; Craig B. Greenberg, Dallas, all of Tex.

[73] Assignee: Texas Instruments Incorporated, Dallas, Tex.

[21] Appl. No.: 46,074

[22] Filed: May 5, 1987

[51] Int. Cl.$^4$ .................................. H03K 3/286
[52] U.S. Cl. .................................. 307/291; 307/443; 307/299.2
[58] Field of Search ............. 307/291, 292, 443, 299.2

[56] References Cited

U.S. PATENT DOCUMENTS

| | | | |
|---|---|---|---|
| 4,093,878 | 6/1978 | Paschal et al. | 307/291 |
| 4,398,105 | 8/1983 | Keller | 307/443 |
| 4,473,760 | 9/1984 | Ambrosius, III et al. | 307/443 |
| 4,575,644 | 3/1986 | Leslie | 307/443 |
| 4,591,737 | 5/1986 | Campbell | 307/291 |

Primary Examiner—John Zazworsky
Attorney, Agent, or Firm—Thomas R. FitzGerald; Leo N. Heiting; Melvin Sharp

[57] ABSTRACT

A flip-flop has a master section (74) comprising two transistors (40, 48). The second transistor (48) has two emitters, the second emitter conducting in response to a metastable condition wherein both transistors (40,48) are conducting concurrently, resulting in a metastable output. The second emitter (76) draws additional current through the second transistor (48) after a delay provided by a second clock (78), thus disrupting the equilibrium of the master section (74). By drawing additional current, the second transistor (48) will turn the first transistor (40) off, enabling a valid output.

15 Claims, 2 Drawing Sheets

METASTABLE DEFEATING FLI-FLOP

TECHNICAL FIELD OF THE INVENTION

This invention pertains in general to flip-flops and more particularly to a flip-flop with superior metastable characteristics.

BACKGROUND OF THE INVENTION

Flip-flops are often used by system designers to synchronize signals operating at different frequencies to a local clock. However, since the signals are asynchronous to the local clock, the setup and hold time specifications associated with the flip-flop are sure to be violated. When the setup and hold time is violated, the output response of the flip-flop is uncertain. The output may assume a "metastable" state, defined as the time period during which the output of a digital logic device is not at logic level 1 or logic level 0, but instead resides at an output level between logic level 0 and logic level 1. The voltage ranges corresponding to different logic levels are specified by the manufacturer of the device. For bipolar TTL technology, for example, the metastable region might lie between 0.8 volts and 2.0 volts.

The metastable problem occurs when the signal being input to the flip-flop is undergoing a transition from one logic level to the other simultaneously with the active edge of the local clock pulse, causing the latch section of the flip-flop to latch at the intermediate voltage level. Since the input data is changing while it is being clocked, the system designer does not care if the flip-flop goes to either a high or low logic level in this instance, just so long as the output does not "hang-up" in the metastable region. Eventually, the output of the flip-flop will stabilize at a valid logic level; however, logic circuitry following the flip-flop depends upon the delay specification (stated time period from the clock pulse to a valid output) being met. A metastable output may cause this logic circuitry to fail. Thus, the metastable characteristics of the flip-flop used to synchronize an asynchronous data stream can influence overall system reliability.

One attempt to mitigate the problem of metastable outputs is to provide a second flip-flop in series with the first flip-flop. The clock to the second flip-flop is delayed relative to clock to the first flip-flop, thus allowing time for the output signal of the first flip-flop to stabilize at a valid logic level before clocking the data into the second flip-flop. Using a dual flip-flop system, the delay from input-to-valid output includes the delay through each of the flip-flops, plus the delay between the clocks to the flip-flops. In many applications, this delay is excessive. Furthermore, the logic may still fail if the output of the first flip-flop remains in the metastable region for a period greater than the delay between the clocks. Also, this arrangements requires the use of two chips and a delay circuit, using valuable board space.

Therefore, a need has arisen for a flip-flop which prevents metastable outputs, and which may be implemented in a single circuit.

SUMMARY OF THE INVENTION

The present invention disclosed and claimed herein describes a method and apparatus for preventing metastable outputs in a flip-flop which,substantially eliminates problems associated with prior art flip-flops.

In one aspect of the invention, a latch circuit is disclosed in which lock-in circuitry generates a valid logic signal in response to an input signal. The lock-in circuitry may generate a metastable signal between valid logic levels in response to an input signal within a predetermined voltage range. Disrupting circuitry is provided for upsetting the equilibrium state in which the metastable signals are generated.

This aspect of the invention has the technical advantage that equilibrium states giving rise to metastable outputs can be upset so as to ensure that input-to-valid output times are met despite metastable conditions using little additional circuitry.

In another aspect of the invention, a latch circuit is disclosed in which first and second switching devices are operable to conduct in response to an input signal. Disrupting circuitry is provided for changing the amount of current conducted by one of the switching devices in response to a condition wherein both transistors are conducting concurrently. The change in current results in one of the transistors being forced into a nonconducting state.

This aspect of the invention has several advantages. First, the delay caused by a metastable condition may be determined with accuracy, such that a definite input-to-valid-output time specification may be relied upon for system design. Second, the additional delay time attributed to metastable conditions can be made very small, such as a time delay of substantially less than two nanoseconds for bipolar TTL technology. Third, a single circuit can be used to prevent metastable outputs, with little additional circuitry.

In another embodiment of the present invention, a flip-flop circuit is disclosed wherein first and second transistors are operable to conduct in response to an input signal The second transistor has two emitters, the second emitter operable to conduct in response to a condition wherein both first and second transistors are conducting concurrently. The second emitter may be connected to a clock which is delayed slightly from the clock connected to the first emitter.

This embodiment of the invention has the advantage that minimal circuitry is needed in order to disrupt the equilibrium of concurrently conducting transistors. Furthermore, the delay associated with this embodiment of the invention can be made as low as one-half of a nanosecond.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

The preferred embodiment of the present invention is best understood by referring to FIGS. 1-4 of the drawings, like numerals being used for like and corresponding parts of the various drawings.

Figure 1:
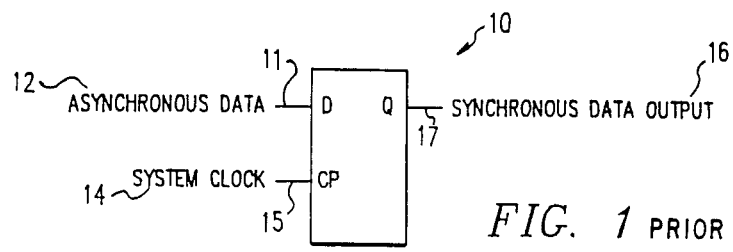
FIG. 1 illustrates a D flip-flip being used to synchronize an asynchronous data stream.

FIG. 1 illustrates the use of a D flip-flop to synchronize an asynchronous data stream. A D flip-flop 10 has a data input 11 receiving an asynchronous data stream 12. The output of a system clock 14 is also received by the clock input 15 of the D flop-flop 10. A synchronous data output 16 is transmitted from the output 17.

In operation, the output 16 of the D flip-flop 10 is equal to the value of the asynchronous data stream 12 at the beginning of the clock pulse. In other words, the D flip-flop 10 outputs a synchronous data output 16 which is equal to the asynchronous data stream 12 sampled at the system clock rate. The output of the D flip-flop 10 is valid after a specified time delay from the active edge of the clock pulse.

Figure 2A:
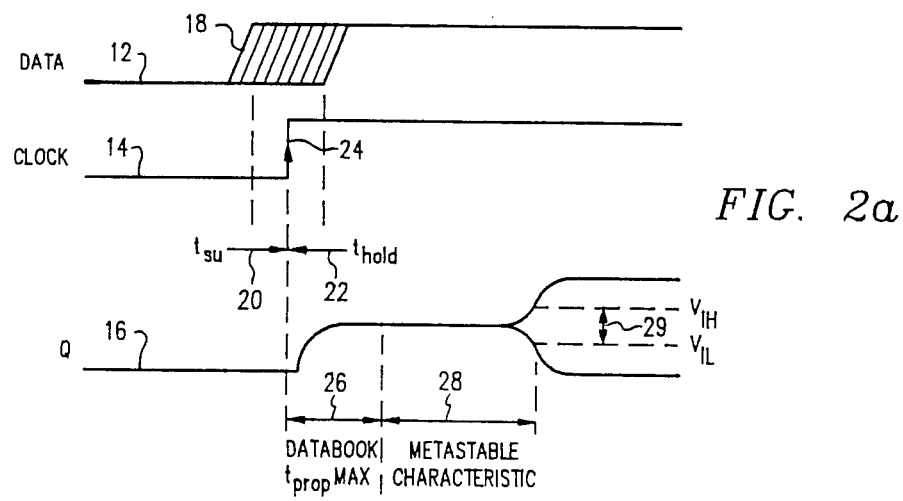
FIGS. 2a and 2b illustrate timing diagrams of conditions under which a metastable output may occur.
Figure 2B:
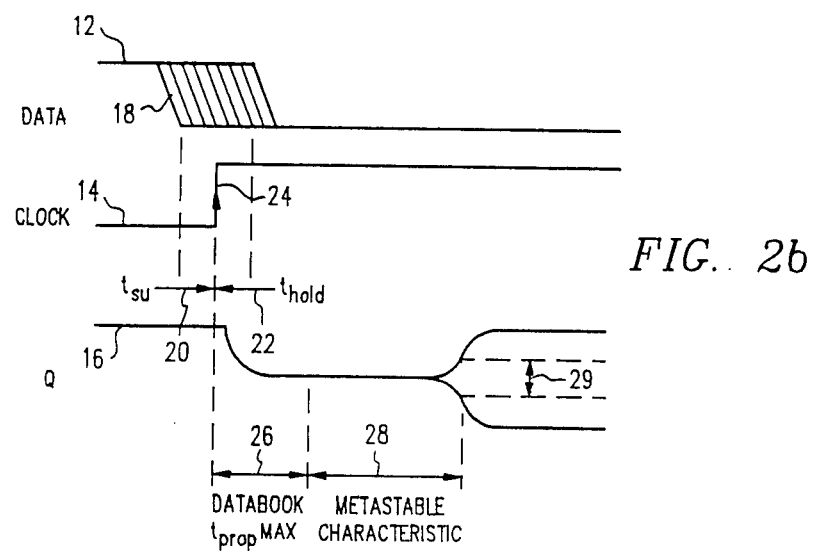

Referring now to FIGS. 2a-b, the problem of metastability is illustrated. The metastability problem occurs when the asynchronous data stream 12 is undergoing a transition between two logic levels concurrently with the active edge of the system clock 14. As shown in FIG. 2a, the data stream is undergoing a logic low to logic high transition. The shaded region 18 represents the time period during which the asynchronous data stream 12 has not settled into a valid logic level. In order to ensure a valid output, the input data must be stable at a valid logic level for a time period represented by the setup time 20 and hold time 22 requirements. The setup time requirement 20 represents the time prior to the active edge of the clock pulse 24 during which the input data should be stable at a valid logic level. The hold time 22 represents the time period during which the input data must remain stable after the active edge of the clock pulse 24.

If the input data is not stable between the setup and hold times 20 and 22, the value of the output 16 is uncertain. While the output 16 may lock into a logical high or logical low value, it may also "hang up" at a voltage in the metastable region which is neither a logical high or a logical low. Under conditions in which the setup and hold requirements 20 and 22 are met, a valid output will appear after a propagation time delay 26. However, if the output hangs up in the metastable region, an additional metastable time delay 28 is necessary before the output 16 assumes a valid logic level. It should be noted that since asynchronous data stream 12 is being sampled at a point between logic levels, either a logical high or logical low output is valid. It should also be noted that while the metastable time delay characteristic represents a time during which most metastable signals will lock into either a high or low logic level in most cases, it would still be possible for the output to hang up for periods greater than the metastable time delay 28.

FIG. 2b illustrates a signal which violates the setup and hold requirements during a logic high to logic low transition. Once again, when the setup time requirement 20 and the hold time requirement 22 are not met, the output 16 may enter the metastable region. In most cases, the output 16 will lock into either a logic high or logic low level within a time indicated by the propagation time delay 26 and the metastable time delay 28.

Figure 3:
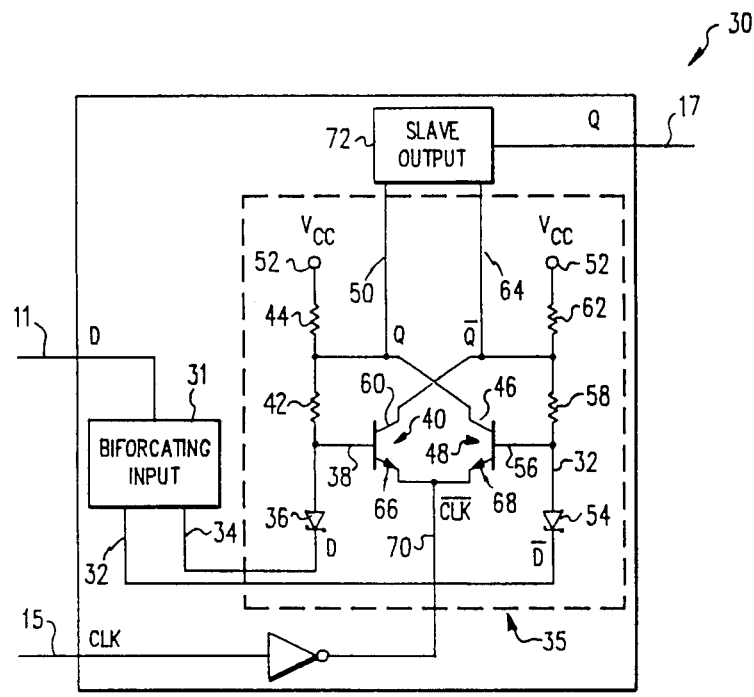
FIG. 3 illustrates a previously developed implementation of a flip-flop.

FIG. 3 illustrates a prior art flip-flop circuit 30. The input 11 is connected to a bifurcating input section 31 which produces an inverted input 32 and non-inverted input 34, which are connected to a master section 35. The non-inverted input 34 is connected to the cathode of a first diode 36. The anode of the first diode 36 is connected to the base 38 of a first transistor 40 and to a resistor 42. The other lead of the resistor 42 is connected to a pullup resistor 44, the collector 46 of a second transistor 48, and a non-inverting output 50. The other lead of the pullup resistor 44 is connected to the power supply voltage, $V_{cc}$ 52.

The inverting input 32 is connected to the cathode of a second diode 54. The anode of the second diode 54 is connected to the base 56 of the second transistor 48 and to a resistor 58. The other lead of the resistor 58 is connected to the collector 60 of the transistor 40, to a pullup resistor 62 and to an inverting output 64. The other lead of the pullup resistor 62 is connected $V_{cc}$ 52.

The emitters 66 and 68 of the transistors 40 and 48, respectively, are connected to an inverted clock 70, which is the inverted signal of the system clock 14. The non-inverted output 50 and inverted output 64 are connected to a slave output section 72. The system clock 14 is inverted in order to produce a falling edge in response to the active edge of the system clock. If the flip-flop is designed such that the falling edge is the active edge, no such inversion is necessary.

The master section 35 comprises a latching circuit for locking in the values of the inverted and non-inverted inputs 32 and 34 at the time of the clock pulse.

The slave output section 72 prevents false outputs from occurring when the inverted clock 70 is in a high state, by latching the outputs 50 and 64 at valid states. The slave output section can be implemented using two nand gates, each having the output of the other as one input. The other input is supplied by the outputs 50 and 64 of the master section 35.

The resistor combinations 42 and 44, and 58 and 62, are proportioned to divide the power supply voltage in a desired ratio. The resistors 42 and 58 should not be so large as to prevent the collectors 46 and 60 from drawing current therethrough.

Under normal operating conditions, wherein the setup and hold time requirements are met, the input from the asynchronous data stream 12 is bifurcated into an inverted input 32 and a non-inverted input 34. Assuming, for illustration, that the input has a value of a logical 1, then the non-inverted input 34 has a logical high voltage and the inverted input 32 has a logical low voltage. Hence, the voltage at the base 38 of the first transistor 40 is substantially higher than the voltage at the base 56 of the second transistor 48. As the inverted clock signal 70 changes from a high to a low voltage, the first transistor 40 turns on when the voltage differential between the base 38 and the inverted clock signal 70 exceeds the base-emitter threshold voltage, $V_{be}$, of about 0.7 volts. Hence, if the base 38 is at 3.8 volts, the transistor 40 will turn on when the inverted clock 70 is at a voltage of 3.1 volts. The transistor 40 will conduct from collector 60 to emitter 66, drawing current away from the base 56 of the transistor 48. Thus, the second transistor 48 is prevented from turning on while the first transistor 40 is conducting.

The metastability problem occurs when the asynchronous data stream is undergoing a transition during the active edge of the system clock signal 14. If the inverted input 32 and non-inverted input 34 have an equal voltage as the inverted clock signal 70 is decreasing, it is possible that both transistors 40 and 48 will turn on simultaneously. For example, if the bases 38 and 56 both have a voltage of 1.8 volts at precisely the time that the inverted clock signal 70 is at 1.1 volts, then both transistors will conduct simultaneously. Since neither transistor will be able to turn the other off, both inverted and non-inverted outputs 64 and 50 will have the same value, resulting in a metastable output. The transistors 40 and 48 will remain on until the system is perturbed by noise on one of the lines. At that point, one transistor will begin conducting more strongly than the other and will eventually draw enough current from the other transistor so as to turn the other transistor off.

It should be noted that the metastability problem cannot be solved by merely designing one transistor larger than the other. Dissymmetry induced prior to the active edge of the clock merely shifts the input conditions which give rise to a mestastable output, but do not prevent it. Thus, if the transistors have different sizes, the metastability problem will occur when the inverted and non-inverted inputs 32 and 34 have a particular ratio in relation to the size of the transistors 40 and 48. In order to prevent a latch from locking in a mestastable condition, a disruption must be induced subsequent to the clock, in order to upset the equilibrium state preventing the latch from locking into valid logic voltages.

Figure 4:
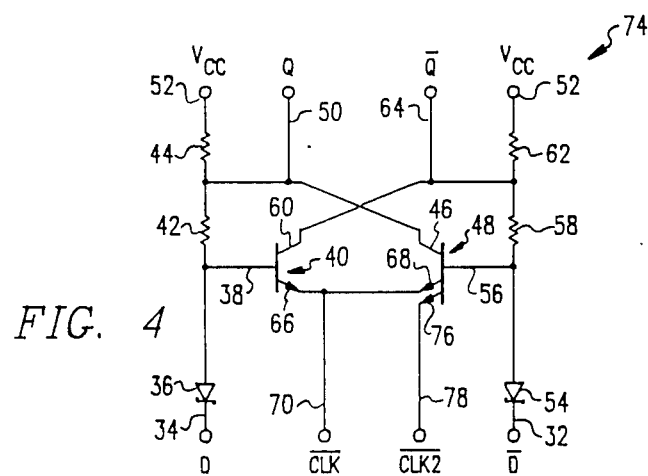
FIG. 4 illustrates the flip-flop of the present invention.

Referring now to FIG. 4, a master section of a flip-flop in accordance with the present invention is illustrated which prevents the flip-flop from remaining in a metastable state. The master section 74 of the present invention has similar construction to the master section 35 of the D flip-flop 30 previously described in connection with FIG. 3, with the addition of a second emitter on the transistor 48 connected to a second inverted clock signal 78 which is offset from the inverted clock signal 70 in both voltage and time.

The second inverted clock signal 78 is slightly delayed from the first inverted clock signal 70, such that its falling edge occurs slightly later in time. The second inverted clock signal 78 may be generated from the inverted clock signal 70. The second inverted clock signal 78 also reaches a low voltage slightly below that of the first inverted clock signal 70.

Under conditions which would give rise to a metastable output, the transistors 40 and 48 will initially conduct simultaneously as described in connection with FIG. 3. Since their emitter currents will be equal, both transistors will conduct an equal amount of current; thus, neither transistor will be able to switch the other off. As a result, the non-inverted and inverted outputs 50 and 64 will be of equal voltage. However, in the master section 74 of the present invention, the additional second emitter 76 disrupts the symmetry of the flip-flop, thus terminating the metastable state. The second emitter 76 disrupts the symmetry by conducting additional current through the transistor 48. The second emitter is turned on after the specified delay, as the second inverted clock signal 78 reaches a voltage lower than the first inverted clock 70. The additional current pulled through the second transistor 48 results in less current being pulled through the base 38 of the transistor 40. The reduction in base current to the transistor 40 results in more base current to the transistor 48, eventually resulting in the first transistor 40 being turned off completely.

Tests have shown that very minor time delays and voltage differences between the inverted clock signal 70 and 78 are sufficient to disrupt the symmetry of the flip-flop. For a bipolar TTL flip-flop, it has been found that a one-half nanosecond delay between the inverted clock 70 and 78 is adequate for the circuit to reach an equilibrium state under metastable conditions, although a time delay of two nanoseconds is used in the preferred embodiment for reliability purposes. Furthermore, the delay and voltage differential is sufficient to allow the master section 74 to latch at valid logic levels if metastable conditions are not present. Using ECL technology, the time delay need only be approximately 200 picoseconds.

Tests have also shown that the necessary voltage differential between the two clock signals 70 and 78 is approximately 5 to 10 millivolts.

It should be noted that if metastable conditions do not exist, then one of the two transistors 40 or 48 will have turned the other off within the time delay between the two clocks. If the transistor 40 has previously turned on, then the second emitter 76 will not be able to conduct; hence, the transistor 48 will remain turned off. If the transistor 48 has previously turned on, then conduction through the second emitter will not affect the outputs 50 and 64. Therefore, under non-metastable conditions, the metastable defeating flip-flop performs in accordance with the prior art flip-flop 30.

Importantly, the equilibrium of the circuit may be disrupted by means other than the addition of a second emitter to one of the transistors as would be known by one skilled in the art. For example, resistor values could be changed after a metastable condition is reached, or, diode characteristics could be altered subsequent to a metastable condition. However, in the preferred embodiment, the second emitter 76 is used as the means for disrupting the circuit, since the addition of a second emitter has been found to have the advantages of being less complicated and less space consuming than other alternatives.

Although the master section 74 of the present invention has been shown as an emitter-coupled cross latch, the invention works with any type latch which may assume an equilibrium state causing a metastable output.

The present invention has the technical advantage that a valid output can be ensured after a definite time period, despite the occurrence of metastable conditions. Furthermore, since the present invention can disrupt equilibrium conditions leading to a metastable output as soon as the equilibrium state is reached, additional delay associated with the prevention of metastable outputs can be as low as one-half of a nanosecond for TTL, substantially less than prior art solutions to metastable outputs. Additionally, the present invention can be implemented with a relatively small amount of circuitry, as opposed to prior art solutions which required duplication of the entire flip-flop circuitry.

The present invention is applicable to all types of flip-flops, including TTL, ECL, MOS, CMOS, and other technologies, and can be used with other flip-flop configurations, such as R-S flip-flops.

While the present invention has been discussed in connection with a flip-flop, any circuit which uses a latch to lock in data values is subject to metastability problems. Memory cells, flip-flops, registers, discrete latches, and other devices are all subject to the metastability problems which may benefit from the present invention.

Although a preferred embodiment of the invention has been described in detail, it should be understood that various changes, substitutions and alterations can be made therein without departing from the spirit and scope of the invention as defined by the appended claims.

What is claimed is:
1. A flip-flop circuit comprising:
   an input to receive input signals;

first and second transistors each responsive to said input signals, said second transistor having a first emitter and a second emitter; and means to render said second emitter conducting in response to concurrent conduction of said first transistor and said first emitter of said second transistor, such that additional current conducted through said second emitter results in nonconduction of said first transistor.

2. The flip-flop circuit of claim 1 and further comprising a clock to drive said second transistor to conduct through said second emitter after a predetermined time interval subsequent to conducting through said first emitter.

3. The flip-flop circuit of claim 1 wherein said second transistor becomes conductive in response to an inverted input signal.

4. The flip-flop circuit of claim 1 and further comprising a first clock for producing a first clock signal, the emitter of the first transistor and the first emitter of the second transistor connected to said first clock.

5. The flip-flop circuit of claim 4 and further comprising a second clock for generating a delayed clock signal, said second emitter connected to said delayed clock signal.

6. A latch circuit comprising:
input circuit means for receiving an input voltage signal;
means responsive to said voltage signal and a first clock signal of predetermined frequency to generate an output signal in one of two predetermined spaced voltage ranges; and
means responsive to a second clock signal subsequent to said first clock signal and a said output signal between said predetermined spaced voltage ranges to shift said output signal into one of said two predetermined spaced voltage ranges.

7. The latch circuit of claim 30 further including a first clock voltage source for generating said first clock signal and a second clock voltage source for generating said second clock signal.

8. The latch circuit of claim 6 wherein said means responsive to said voltage signal includes first and second semiconductor devices for generating said output signal and the complement thereof.

9. The latch circuit of claim 7 wherein said means responsive to said voltage signal includes first and second semiconductor devices for generating said output signal and the complement thereof.

10. The latch circuit of claim 8 further including means responsive to said second clock signal to alter current flow in said second semiconductor device.

11. The latch circuit of claim 9 further including means responsive to said second clock signal to alter current flow in said second semiconductor device.

12. The latch circuit of claim 8 wherein said second semiconductor device comprises first and second emitter electrodes.

13. The latch circuit of claim 9 wherein said second semiconductor device comprises first and second emitter electrodes.

14. The latch circuit of claim 10 wherein said second semiconductor device comprises first and second emitter electrodes, said second emitter electrode being controlled by said second clock signal.

15. The latch circuit of claim 11 wherein said second semiconductor device comprises first and second emitter electrodes, said second emitter electrode being controlled by said second clock signal.

* * * * *